(12) United States Patent
Shi

(10) Patent No.: US 10,008,166 B2
(45) Date of Patent: Jun. 26, 2018

(54) GATE DRIVER ON ARRAY CIRCUIT

(71) Applicant: SHENZHEN CHINA STAR OPTOELECTRONICS TECHNOLOGY CO., LTD., Shenzhen, Guangdong (CN)

(72) Inventor: Longqiang Shi, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 274 days.

(21) Appl. No.: 15/034,691

(22) PCT Filed: Apr. 7, 2016

(86) PCT No.: PCT/CN2016/078726
§ 371 (c)(1),
(2) Date: May 5, 2016

(87) PCT Pub. No.: WO2017/143646
PCT Pub. Date: Aug. 31, 2017

(65) Prior Publication Data
US 2018/0090087 A1    Mar. 29, 2018

(30) Foreign Application Priority Data
Feb. 26, 2016    (CN) .......................... 2016 1 0109446

(51) Int. Cl.
*G09G 3/36*    (2006.01)

(52) U.S. Cl.
CPC ......... *G09G 3/3648* (2013.01); *G09G 3/3677* (2013.01); *G09G 2290/00* (2013.01);
(Continued)

(58) Field of Classification Search
CPC ............... G09G 3/3648; G09G 3/3677; G09G 2290/00; G09G 2300/0408; G09G 2310/0264
See application file for complete search history.

(56) References Cited

U.S. PATENT DOCUMENTS 8,194,026 B2 *   6/2012   Lee ...................... G09G 3/3677
                                                          257/72
9,779,684 B2 *  10/2017   Li ......................... G09G 3/3677
(Continued)

*Primary Examiner* — Afroza Chowdhury
(74) *Attorney, Agent, or Firm* — Ladas & Parry LLP

(57) ABSTRACT

A GOA circuit includes multiple GOA circuit units, each of which includes a pull-down holding module to hold the voltage level of the second control node during the non-scanning period, so to keep the scan signal at a low voltage level. The GOA circuit unit uses a first transistor and a second transistor, operating along with a first clock signal and a second clock signal, so that a pull-down holding module continues outputting signals so to turn on the pull-down module when the scan signal is in the period that does not need to output pulses. Therefore, during the period when the scan signal does not need to output pulses, the pull-down module is still turned on and pulls down the voltage level. The present disclosure solves the problem that the pull-down holding module cannot operate continuously, and improves the stability in outputting scan signals of GOA circuit units.

11 Claims, 3 Drawing Sheets

(52) U.S. Cl.
CPC ............... *G09G 2300/0408* (2013.01); *G09G 2310/0264* (2013.01)

(56) References Cited

U.S. PATENT DOCUMENTS

| | | | |
|---|---|---|---|
| 9,786,242 B2 * | 10/2017 | Dai | G09G 3/3677 |
| 9,922,611 B2 * | 3/2018 | Zhao | G09G 3/3674 |
| 2008/0036725 A1 * | 2/2008 | Lee | G09G 3/3677 345/100 |
| 2008/0074379 A1 * | 3/2008 | Kim | G09G 3/3677 345/99 |
| 2008/0100560 A1 * | 5/2008 | Na | G09G 3/3677 345/101 |

* cited by examiner

GATE DRIVER ON ARRAY CIRCUIT

BACKGROUND OF THE INVENTION

1. Field of the Invention

The present invention is related to the field of liquid crystal display (LCD), and more specifically, to an LCD that uses a gate driver on array (GOA) circuit.

2. Description of the Prior Art

A GOA circuit makes use of the thin-film transistor LCD (TFT-LCD) array process to form a gate driver on a GOA substrate with thin-film transistor (TFT) arrays to realize a driving method of progressive scan.

A GOA circuit comprises a plurality of GOA circuit units. A conventional GOA circuit unit outputs scan signals by controlling the gate voltage (i.e. Q node voltage) that is outputted to the transistors. A conventional GOA circuit unit takes clock signals as an input of a pull-down holding module, therefore the pull-down holding module only operates during the period when the clock signal generates pulses. During the period when the clock signal does not generate pulses, the pull-down holding module does not operate, so that the scan signal at an output terminal cannot stay at a low electric potential.

Therefore, it is necessary to improve conventional technology so that during the period when the clock signal does not generate pulses, the pull-down holding module can still pull down the scan signal to keep it at a low voltage level.

SUMMARY OF THE INVENTION

An object of the present invention is to provide a GOA circuit so to solve existing technical problem.

According to the present invention, a gate driver on array (GOA) comprises: a plurality of GOA circuit units connected in cascade, with the GOA circuit unit at each stage outputting a scan signal via an output terminal based on a scan signal outputted by a previous stage GOA circuit unit, a scan signal outputted by a next stage GOA circuit unit, a first clock signal and a second clock signal. The GOA circuit unit at each stage comprises: an input control module that is turned on when receiving the scan signal outputted by the previous stage GOA circuit unit, so to control the voltage level of the first control node; an output control module, electrically connected to the first control node, so to control the voltage applied to the first control node which controls the outputted scan signal; a pull-down module, electrically connected to the output control module to pull down the voltage level of the scan signal based on the voltage level of a second control node; and a pull-down holding module, electrically connected to the pull-down module to hold the voltage level of the second control node during the non-scanning period, so to keep the scan signal at a low voltage level. The pull-down holding module comprises: a first transistor, comprising a first control terminal and a first input terminal electrically connected to the first clock signal; a second transistor, comprising a second control terminal and a second input terminal electrically connected to the second clock signal; a third transistor, comprising a third control terminal and a third input terminal electrically connected to a first output terminal of the first transistor; a fourth transistor, comprising a fourth control terminal electrically connected to the first control node, a fourth input terminal electrically connected to a third output terminal of the third transistor, and a fourth output terminal electrically connected to a constant voltage; a fifth transistor, comprising a fifth control terminal electrically connected to the third output terminal of the third transistor, a fifth input terminal electrically connected to the first output terminal of the first transistor, and a fifth output terminal electrically connected to the second control node; and a sixth transistor, comprising a sixth control terminal electrically connected to the first control node, a sixth input terminal electrically connected to the second control node, and a sixth output terminal electrically connected to a constant voltage.

In one aspect of the present invention, the pull-down module comprises: a seventh transistor, comprising a seventh control terminal electrically connected to the second control node, a seventh input terminal electrically connected to the first control node, and a seventh output terminal electrically connected to a constant voltage; an eighth transistor, comprising an eighth control terminal electrically connected to the second control node, an eighth input terminal electrically connected to the output terminal, and an eighth output terminal electrically connected to the constant voltage; a ninth transistor, comprising a ninth control terminal electrically connected to a scan signal outputted by the next stage GOA circuit unit, a ninth input terminal electrically connected to the output terminal, and a ninth output terminal electrically connected to the constant voltage.

In another aspect of the present invention, the input control module comprises a tenth transistor, comprising a tenth control terminal and a tenth input terminal electrically connected to a scan signal outputted by a previous stage GOA circuit unit, and a tenth output terminal electrically connected to the first control node.

In still another aspect of the present invention, the output control module comprises: an eleventh transistor, comprising an eleventh control terminal electrically connected to the first control node, an eleventh input terminal electrically connected to the first clock signal, and an eleventh output terminal electrically connected to the output terminal; a twelfth transistor, comprising a twelfth control terminal electrically connected to the first control node, and a twelfth input terminal electrically connected to the first clock signal; and a capacitor, electrically connected between the first control node and the output terminal.

In yet another aspect of the present invention, the first clock signal and the second clock signal are inversed.

According to the present invention, a gate driver on array (GOA) comprises: a plurality of GOA circuit units connected in cascade, with the GOA circuit unit at each stage outputting a scan signal via an output terminal based on the scan signal outputted by a previous stage GOA circuit unit, a scan signal outputted by a next stage GOA circuit unit, a first clock signal and a second clock signal. The GOA circuit unit at each stage comprises: an input control module that is turned on when receiving the scan signal outputted by the previous stage GOA circuit unit so to control the voltage level of a first control node; an output control module electrically connected to the first control node to control the outputted scan signal based on the voltage applied to the first control node; a pull-down module, electrically connected to the output control module, so to pull down the voltage level of the scan signal based on the voltage level of the second control node; and a pull-down holding module, electrically connected to the pull-down module, to hold the voltage level of the second control node during the non-scanning period, so to keep the scan signal at a low voltage level. The pull-down holding module comprises: a first transistor, comprising a first control terminal and a first input terminal electrically connected to the first clock signal; a second transistor, comprising a second control terminal and a second input terminal electrically connected to the first clock signal, and a second input terminal electrically connected to the second control node; a third transistor, comprising a third control terminal and a third input terminal electrically connected to the second clock signal; a fourth transistor, comprising a fourth control terminal electrically connected to a first control node, a fourth input terminal electrically connected to the third output terminal of the third transistor, and a fourth output terminal electrically connected to a constant voltage; a fifth transistor, comprising a fifth control terminal and a fifth input terminal electrically connected to the second clock signal, and a fifth output terminal electrically connected to the second control node; and a sixth transistor, comprising a sixth control terminal electrically connected to the first control node, a sixth input terminal electrically connected to the second control node, and a sixth output terminal electrically connected to the constant voltage.

In one aspect of the present invention, the pull-down module comprises: a seventh transistor, comprising a seventh control terminal electrically connected to the second control node, a seventh input terminal electrically connected to the first control node, and a seventh output terminal electrically connected to a constant voltage; an eighth transistor, comprising an eighth control terminal electrically connected to the second control node, an eighth input terminal electrically connected to the output terminal, and an eighth output terminal electrically connected to the constant voltage; a ninth transistor, comprising a ninth control terminal electrically connected to a scan signal outputted by the next stage GOA circuit unit, a ninth input terminal electrically connected to the output terminal, and a ninth output terminal electrically connected to the constant voltage.

In another aspect of the present invention, the input control module comprises a tenth transistor, comprising a tenth control terminal and a tenth input terminal electrically connected to a scan signal outputted by a previous stage GOA circuit unit, and a tenth output terminal electrically connected to the first control node.

In still another aspect of the present invention, the output control module comprises: an eleventh transistor, comprising an eleventh control terminal electrically connected to the first control node, an eleventh input terminal electrically connected to the first clock signal, and an eleventh output terminal electrically connected to the output terminal; a twelfth transistor, comprising a twelfth control terminal electrically connected to the first control node, and a twelfth input terminal electrically connected to the first clock signal; and a capacitor, electrically connected between the first control node and the output terminal.

In yet another aspect of the present invention, the first clock signal and the second clock signal are inversed.

In contrast to prior art, the GOA circuit unit of the present invention makes use of a first transistor and a second transistor, operating along with the design of a first clock signal and a second clock signal, so that a pull-down holding module can continue outputting signals so to turn on the pull-down module when the scan signal is in the period that does not need to output pulses. Therefore, during the period when the scan signal does not need to output pulses, the pull-down module is still turned on and pulls down the voltage level. The present invention solves the existing technical problem that the pull-down holding module cannot operate continuously. It delivers a beneficial effect that improves the stability in outputting scan signals of GOA circuit units.

These and other features, aspects and advantages of the present disclosure will become understood with reference to the following description, appended claims and accompanying figures.

DETAILED DESCRIPTION OF PREFERRED EMBODIMENTS

Figure 1:
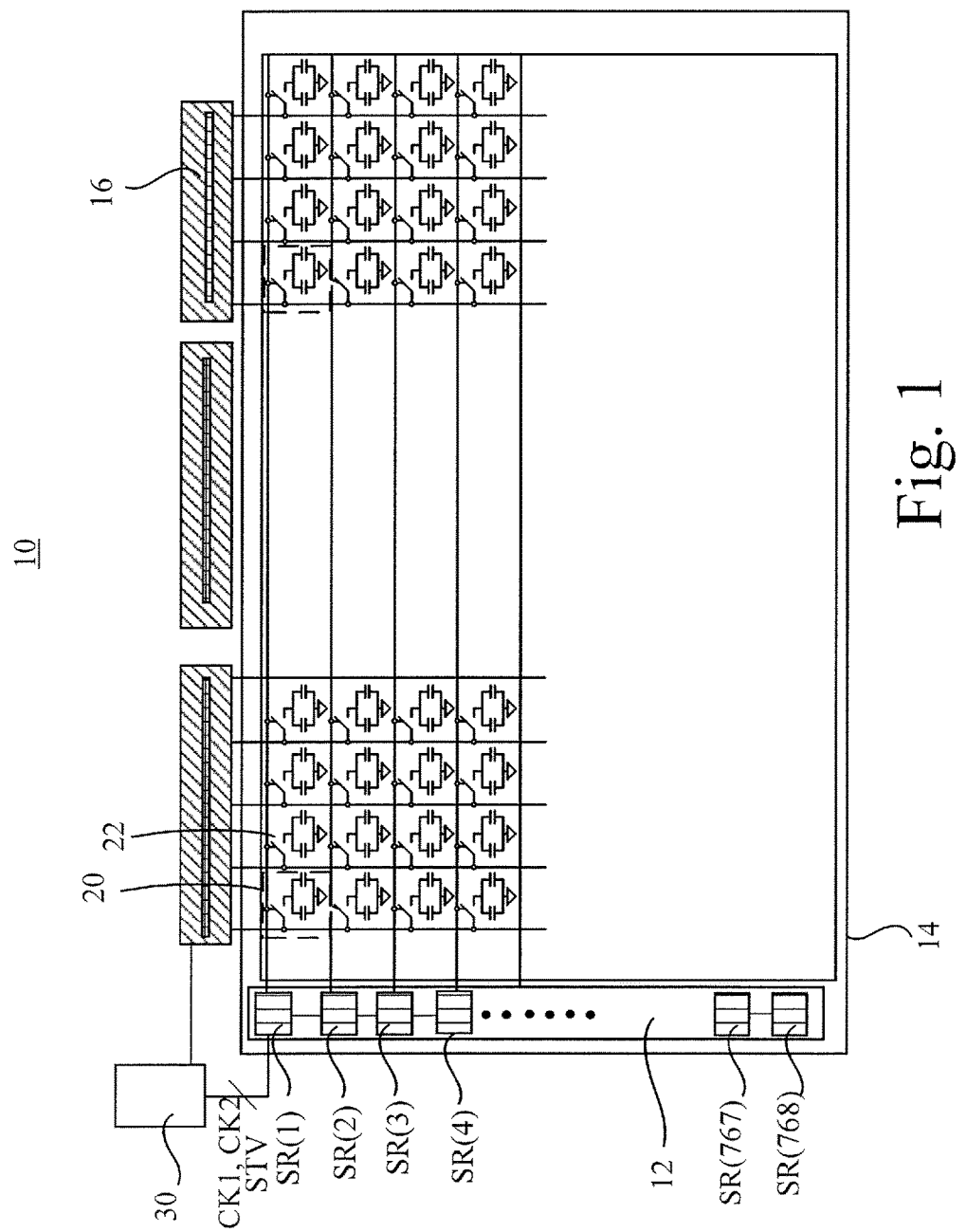
FIG. 1 is a functional block diagram of a liquid crystal display (LCD) according to a preferred embodiment of the present invention.

Please refer to FIG. 1. FIG. 1 is a functional block diagram of a liquid crystal display (LCD) 10 according to a preferred embodiment of the present invention. The LCD 10 comprises a glass substrate 14, a time controller 30, and a source driver 16. The glass substrate 14 is installed with a plurality of pixels arranged in arrays and a GOA circuit 12. Each pixel comprises three pixel units 20, representing red (R), green (G) and blue (B) respectively. The time controller 30 generates clock signals CK1 and CK2, and a start signal STV. The GOA circuit 12 outputs scan signals at a fixed interval so that transistors 22 in each row are turned on one after another. Meanwhile, the source driver 16 outputs corresponding data signals to a whole row of pixel units 20 so that they are charged to their respective voltages to display different grey scales. When the charging of one row is completed, the GOA circuit 12 turns off the scan signals of the row and then turns on transistors 22 in the next row. Then, the source driver 16 charges or discharges the pixel units 20 in the next row. The procedure continues until all pixel units 20 complete charging, and the process starts again from the first row. Take a LCD 10 with 1024×768 resolution and 60 Hz frame rate as an example. It requires a total of 1024×768×3 pixel units 20, and the display time of each frame is approximately 1/60=16.67 ms. The GOA circuit 12 shown in FIG. 1 controls N GOA circuit units, comprising SR(1) to SR(N), with N being 768.

Figure 2:
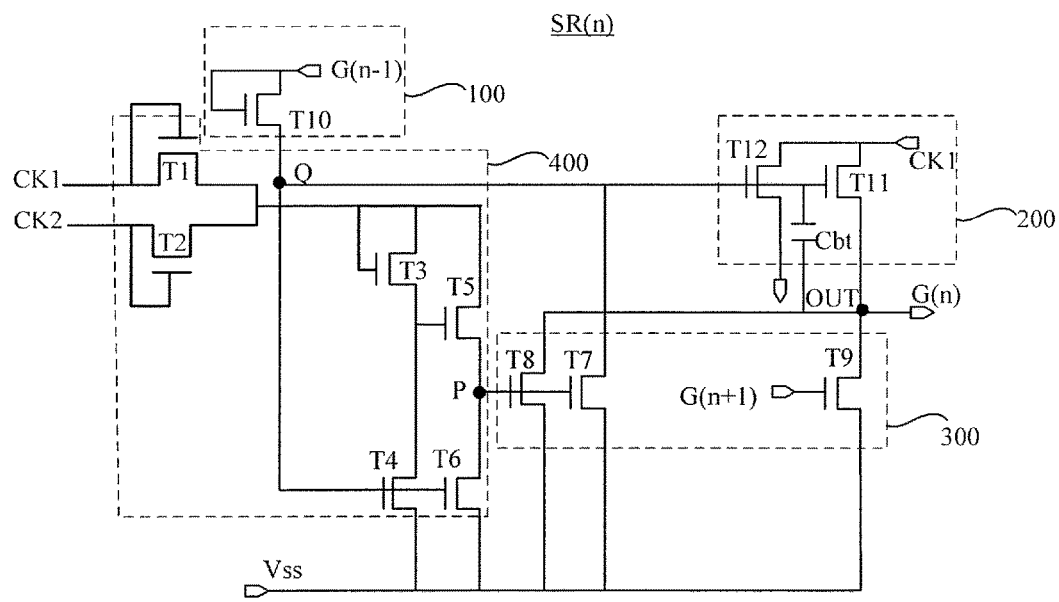
FIG. 2 is a circuit diagram of a GOA circuit unit according to a first embodiment of the present invention.

Please refer to FIG. 1 and FIG. 2. FIG. 2 is a circuit diagram of a GOA circuit unit SR(n) according to a first embodiment of the present invention. To narrow the non-displaying area (where the GOA circuit 12 is placed on the glass substrate 14) of the LCD 10, the GOA circuit 12 is installed on the glass substrate 14 directly. The GOA circuit 12 comprises a plurality of cascade-connected GOA circuit units SR(n), with n ranging from 0 to N. When the GOA circuit unit SR(1) receives the start signal STV, it generates a scan signal G(1) according to clock signals CK1 and CK2. Then, the GOA circuit unit SR(n) at each stage outputs a scan signal G(n) via an output terminal OUT based on a scan signal G(n−1) outputted by a previous stage GOA circuit unit SR(n−1), a scan signal (G+1) outputted by a next stage GOA circuit unit SR(n+1), the first clock signal CK1 and the second clock signal CK2. The first clock signal CK1 and second clock signal CK2 are inversed.

The GOA circuit unit SR(n) at each stage comprises an input control module 100, an output control module 200, a pull-down module 300 and a pull-down holding module 400. The input control module 100 receives the scan signal G(n−1) outputted by the previous stage GOA circuit unit SR(n−1), so to control the voltage level of a first control node Q. The output control module 200 electrically connected to the control node Q, so to control the outputted scan signal G(n) based on the voltage applied on the first control node Q. The pull-down module 300 electrically connects the output control module 200, so to pull down the voltage level of the scan signal G(n) based on the voltage level of a second control node P.

The pull-down holding module 400 electrically connects the pull-down module 300 to hold the voltage level of the second control node P during non-scanning period, so to hold the low voltage level of the scan signal G(n). The pull-down holding module 400 comprises a first transistor T1, a second transistor T2, a third transistor T3, a fourth transistor T4, a fifth transistor T5 and a sixth transistor T6. The first transistor T1 comprises a first control terminal and a first input terminal electrically connected to the first clock signal CK1. The second transistor T2 comprises a second control terminal and a second output terminal electrically connected to the second clock signal CK2. The third transistor T3 comprises a third control terminal and a third input terminal electrically connected to a first output terminal of the first transistor T1. The fourth transistor T4 comprises a fourth control terminal electrically connected to the first control node Q, a fourth input terminal electrically connected to a third output terminal of the third transistor T3, and a fourth output terminal electrically connected to a constant low voltage Vss. The fifth transistor T5 comprises a fifth control terminal electrically connected to the third output terminal of the third transistor T3, a fifth input terminal electrically connected to the first output terminal of the first transistor T1, and a fifth output terminal electrically connected to the second control node P. The sixth transistor T6 comprises a sixth control terminal electrically connected to the first control node Q, a sixth input terminal electrically connected to the second control node P, and a sixth output terminal electrically connected to a constant low voltage Vss.

The pull-down module 300 comprises a seventh transistor T7, an eighth transistor T8 and a ninth transistor T9. The seventh transistor T7 comprises a seventh control terminal electrically connected to the second control node P, a seventh input terminal electrically connected to the first control node Q, and a seventh output terminal electrically connected to the constant low voltage Vss. The eighth transistor T8 comprises an eighth control terminal electrically connected to the second control node P, an eighth input terminal electrically connected to an output terminal OUT, and an eighth output terminal electrically connected to the constant low voltage Vss. The ninth transistor T9 comprises a ninth control terminal electrically connected to the scan signal G(n+1) outputted by the next stage GOA circuit unit SR(n+1) a ninth input terminal electrically connected to the output terminal OUT, and a ninth output terminal electrically connected to the constant voltage Vss.

The input control module 100 comprises a tenth transistor T10. The tenth transistor T10 comprises a tenth control terminal and a tenth input terminal electrically connected to the scan signal G(n−1) outputted by the previous stage GOA circuit unit SR(n−1), and a tenth output terminal electrically connected to the first control node Q.

The output control module 200 comprises an eleventh transistor T11, a twelfth transistor T12 and a capacitor Cbt. The eleventh transistor T11 comprises an eleventh control terminal electrically connected to the first control node Q, an eleventh input terminal electrically connected to the first clock signal CK1, and an eleventh output terminal electrically connected to the output terminal OUT. The twelfth transistor T12 comprises a twelfth control terminal electrically connected to the first control node Q, and a twelfth input terminal electrically connected to the first clock signal CK1. The capacitor Cbt is connected between the first control node Q and the output terminal OUT.

All transistors of circuit units SR(n) of the GOA in FIG. 2 are N-type metal oxide semiconductor (NMOS) transistors. Preferably, the control terminals, input terminals and output terminals of all transistors T1 to T12 are, respectively, the gates, drains and sources of the transistors T1 to T12. In another embodiment, the input and output terminals of transistors T1 to T12, respectively, can be the sources and drains of the transistors.

Figure 3:
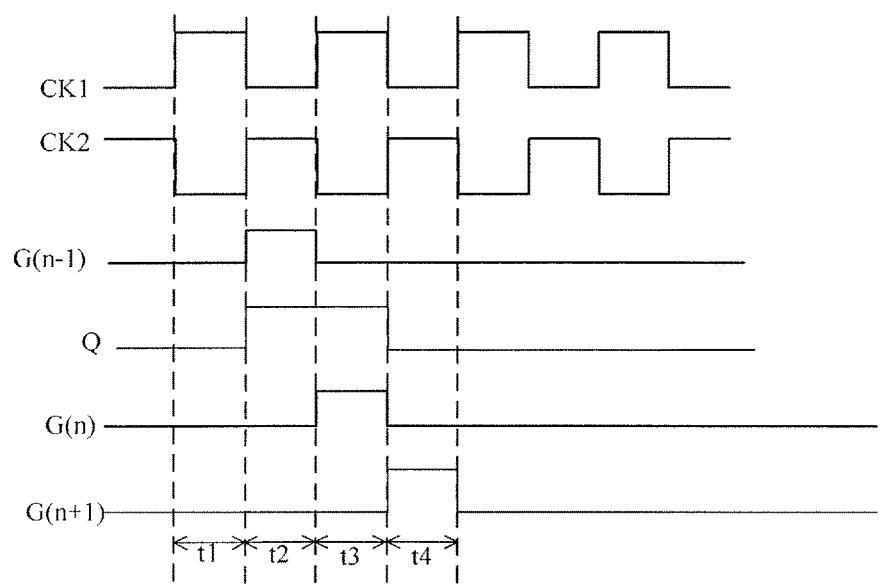
FIG. 3 is a timing diagram of various input signals, output signals and node voltages shown in FIG. 2.

Please refer to FIG. 3. FIG. 3 is a timing diagram of various input signals, output signals and node voltages shown in FIG. 2. The period during which each GOA circuit unit SR(n) receives the scan signal G(n−1) and outputs the scan signal G(n), i.e. the period from t2 to t3 shown in FIG. 3, is called "scan period"; the rest part of the time is called "non-scanning period." The scan period is further divided into a pre-charging period (t2) and a pulse-outputting period (t3).

During a period t1, when the first control terminal of the first transistor T1 receives the first clock signal CK1 at a high voltage level, the transistor T1 is turned on so that the first clock signal CK1 at a high voltage level is sent to the third control terminal of the third transistor T3. The transistor T3 is turned on so that the first clock signal CK1 at a high voltage level is sent to the fifth control terminal of the transistor T5. The transistor T5 is turned on so that the first clock signal CK1 at a high voltage level is sent to the second control node P. The transistor T8 is turned on and sends the constant low voltage Vss to the output terminal OUT, so that the scan signal G(n) is at a low voltage level.

During a period t2, when the tenth control terminal of the transistor T10 receives the scan signal G(n−1) at a high voltage level, the transistor T10 is turned on so that the first control node Q is at a high voltage level, turning on the transistors T4, T6, T11 and T12. Concurrently, the transistor T11 turns on the first clock signal CK1 at a low voltage level and sends it to the output terminal OUT, so the scan signal G(n) is also at a low voltage level. At the same time, the transistor T6 turns on and sends the constant low voltage Vss to the second control node P.

During a period t3, although the transistor T10 is turned off because of receiving the scan signal G(n−1) at a low voltage level, with capacitor Cbt storing electric charges, the first control node Q still remains at a high voltage level. At this point, the transistor T11 turns on the first clock signal CK1 at a high voltage level and sends it to the output terminal OUT, therefore the scan signal G(n) is at a high voltage level.

During a period t4, the second control terminal of the transistor T2 receives the second clock signal CK2 at a high voltage level. The transistor T2 is turned on so that the second clock signal CK2 at a high voltage level is sent to the third control terminal of the transistor T3. The transistor T3 is turned on so that the second clock signal CK2 at a high voltage level is sent to the fifth control terminal of the transistor T5. The transistor T5 is turned on so that the second clock signal CK2 at a high voltage level is sent to the second control node P. The transistor T8 turns on and sends the constant low voltage Vss to the output terminal OUT, so that the scan signal G(n) is at a low voltage level.

In contrast to prior art, the GOA circuit unit of the present invention makes use of a first transistor T1 and a second transistor T2, operating along with the design of a first clock signal CK1 and a second clock signal CK2, so that a pull-down holding module 400 can continue outputting signals so to turn on the pull-down module 300 when the scan signal G(n) is in the period that does not need to output pulses. Therefore, during the period when the scan signal G(n) does not need to output pulses, the pull-down module 300 is still turned on and pulls down the voltage level. The present invention solves the existing technical problem that the pull-down holding module cannot operate continuously. It delivers a beneficial effect that improves the stability in outputting scan signals of GOA circuit units.

Figure 4:
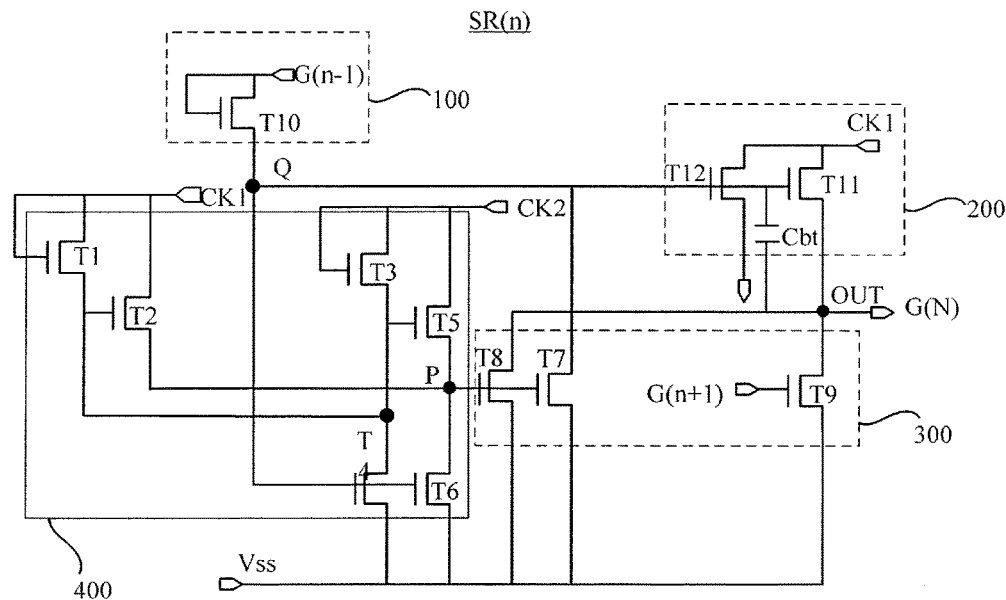
FIG. 4 is a circuit chart of the GOA circuit unit according to a second embodiment of the present invention.

Please refer to FIG. 4. FIG. 4 is a circuit chart of the GOA circuit unit SR(n) according to a second embodiment of the present invention. The differences between the embodiment of FIG. 4 and the embodiment of FIG. 2 lies in the circuit structure of the pull-down holding module 400. The pull-down holding module 400 comprises a first transistor T1, a second transistor T2, a third transistor T3, a fourth transistor T4, a fifth transistor T5, and a sixth transistor T6. The first transistor T1 comprises a first control terminal and a first input terminal electrically connected to a first clock signal CK1. The second transistor T2 comprises a second control terminal and a second input terminal electrically connected to the first clock signal CK1, and a second output terminal electrically connected to a second control node P. A third transistor T3 comprises a third control terminal and a third input terminal electrically connected to the second clock signal CK2. The fourth transistor T4 comprises a fourth control terminal electrically connected to the first control node Q, a fourth input terminal electrically connected to the third output terminal of the third transistor T3, and a fourth output terminal electrically connected to a constant low voltage Vss. The fifth transistor T5 comprises a fifth control terminal and a fifth input terminal electrically connected to a second clock signal CK2, and a fifth output terminal electrically connected to a second control node P. The sixth transistor T6 comprises a sixth control terminal electrically connected to the first control node Q, a sixth input terminal electrically connected to the second control node P, and a sixth output terminal electrically connected to a constant low voltage Vss.

Figure 5:
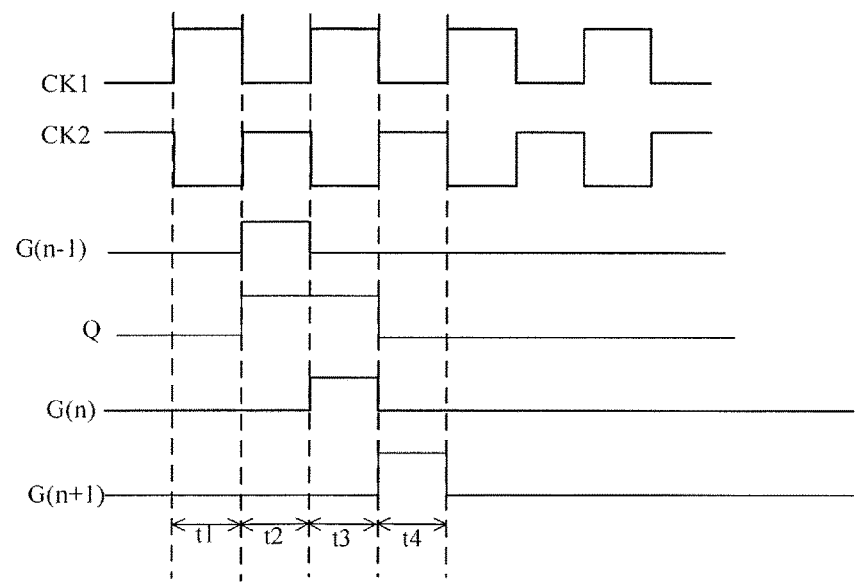
FIG. 5 is a timing diagram of various input signals, output signals and node voltages shown in FIG. 4.

Pleas also refer to FIG. 5. FIG. 5 is a timing diagram of various input signals, output signals and node voltages shown in FIG. 4. During a period t1, when the first control terminal of the transistor T1 receives the first clock signal CK1 at a high voltage level, the transistor T1 turns on so that the first clock signal CK1 at a high voltage level is sent to the second control terminal of the transistor T2. The transistor T2 is turned on so that the first clock signal CK1 at a high voltage level is sent to the second control node P. The transistor T8 turns on and sends the constant low voltage Vss to the output terminal OUT, so that the scan signal G(n) is at a low voltage level.

During a period t2, when a tenth control terminal of the transistor T10 receives the scan signal G(n−1) at a high voltage level, the transistor T10 is turned on so that the first control node Q is at a high voltage level, turning on the transistors T4, T6, T11 and T12. Therefore, the transistor T11 turns on the first clock signal CK1 at a low voltage level and sends it to the output terminal OUT, so the scan signal G(n) is at a low voltage level. At the same time, the transistor T6 turns on the constant low voltage Vss and sends it to the second control node P.

During a period t3, although the transistor T10 is turned off because of receiving the scan signal G(n−1) at a low voltage level, the first control node Q still holds at a high voltage level because a capacitor Cbt stores electric charges. Concurrently, the transistor T11 turns on the first clock signal CK1 at a high voltage level and sends it to the output terminal OUT. Therefore, the scan signal G(n) is still at a high voltage level.

During a period t4, when the third control terminal of the transistor T3 receives the second clock signal CK2 at a high voltage level, the transistor T3 is turned on so that the second clock signal CK2 at a high voltage level is sent to the fifth control terminal of the transistor T5. The transistor T5 is turned on so that the second clock signal CK2 at a high voltage level is sent to a second control node P. The transistor T8 turns on and sends the constant low voltage Vss to the output terminal OUT, so the scan signal G(n) is still at a low voltage level.

In contrast to prior art, the GOA circuit unit of the present invention makes use of a first transistor T1 and a second transistor T2, operating along with the design of a first clock signal CK1 and a second clock signal CK2, so that a pull-down holding module 400 can continue outputting signals so to turn on the pull-down module 300 when the scan signal G(n) is in the period that does not need to output pulses. Therefore, during the period when the scan signal G(n) does not need to output pulses, the pull-down module 300 is still turned on and pulls down the voltage level. The present invention solves the existing technical problem that the pull-down holding module cannot operate continuously. It delivers a beneficial effect that improves the stability in outputting scan signals of GOA circuit units.

One skilled in the art can replace all or part of the NMOS transistors with PMOS transistors to realize a GOA circuit unit that has the same function.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:
1. A gate driver on array (GOA), comprising:
a plurality of GOA circuit units connected in cascade, with the GOA circuit unit at each stage outputting a scan signal via an output terminal based on a scan signal outputted by a previous stage GOA circuit unit, a scan signal outputted by a next stage GOA circuit unit, a first clock signal and a second clock signal; the GOA circuit unit at each stage comprises:
an input control module that is turned on when receiving the scan signal outputted by the previous stage GOA circuit unit, so to control the voltage level of the first control node;
an output control module, electrically connected to the first control node, so to control the voltage applied to the first control node which controls the outputted scan signal;
a pull-down module, electrically connected to the output control module to pull down the voltage level of the scan signal based on the voltage level of a second control node; and a pull-down holding module, electrically connected to the pull-down module to hold the voltage level of the second control node during the non-scanning period, so to keep the scan signal at a low voltage level, comprising:
a first transistor, comprising a first control terminal and a first input terminal electrically connected to the first clock signal;
a second transistor, comprising a second control terminal and a second input terminal electrically connected to the second clock signal;
a third transistor, comprising a third control terminal and a third input terminal electrically connected to a first output terminal of the first transistor;
a fourth transistor, comprising a fourth control terminal electrically connected to the first control node, a fourth input terminal electrically connected to a third output terminal of the third transistor, and a fourth output terminal electrically connected to a constant voltage:
a fifth transistor, comprising a fifth control terminal electrically connected to the third output terminal of the third transistor, a fifth input terminal electrically connected to the first output terminal of the first transistor, and a fifth output terminal electrically connected to the second control node; and
a sixth transistor, comprising a sixth control terminal electrically connected to the first control node, a sixth input terminal electrically connected to the second control node, and a sixth output terminal electrically connected to a constant voltage,
wherein the first clock signal and the second clock signal are inversed, and the pull-down module comprises:
a seventh transistor, comprising a seventh control terminal electrically connected to the second control node, a seventh input terminal electrically connected to the first control node, and a seventh output terminal electrically connected to a constant voltage;
an eighth transistor, comprising an eighth control terminal electrically connected to the second control node, an eighth input terminal electrically connected to the output terminal, and an eighth output terminal electrically connected to the constant voltage;
a ninth transistor, comprising a ninth control terminal electrically connected to a scan signal outputted by the next stage GOA circuit unit, a ninth input terminal electrically connected to the output terminal, and a ninth output terminal electrically connected to the constant voltage.

2. The GOA circuit of claim 1, wherein the input control module comprises a tenth transistor, comprising a tenth control terminal and a tenth input terminal electrically connected to a scan signal outputted by a previous stage GOA circuit unit, and a tenth output terminal electrically connected to the first control node.

3. The GOA circuit of claim 2, wherein the output control module comprises:
an eleventh transistor, comprising an eleventh control terminal electrically connected to the first control node, an eleventh input terminal electrically connected to the first clock signal, and an eleventh output terminal electrically connected to the output terminal;
a twelfth transistor, comprising a twelfth control terminal electrically connected to the first control node, and a twelfth input terminal electrically connected to the first clock signal; and a capacitor, electrically connected between the first control node and the output terminal.

4. A gate driver on array (GOA), comprising:
a plurality of GOA circuit units connected in cascade, with the GOA circuit unit at each stage outputting a scan signal via an output terminal based on a scan signal outputted by a previous stage GOA circuit unit, a scan signal outputted by a next stage GOA circuit unit, a first clock signal and a second clock signal; the GOA circuit unit at each stage comprises:
an input control module that is turned on when receiving the scan signal outputted by the previous stage GOA circuit unit, so to control the voltage level of the first control node;
an output control module, electrically connected to the first control node, so to control the voltage applied to the first control node which controls the outputted scan signal;
a pull-down module, electrically connected to the output control module to pull down the voltage level of the scan signal based on the voltage level of a second control node; and
a pull-down holding module, electrically connected to the pull-down module to hold the voltage level of the second control node during the non-scanning period, so to keep the scan signal at a low voltage level, comprising:
a first transistor, comprising a first control terminal and a first input terminal electrically connected to the first clock signal;
a second transistor, comprising a second control terminal and a second input terminal electrically connected to the second clock signal;
a third transistor, comprising a third control terminal and a third input terminal electrically connected to a first output terminal of the first transistor;
a fourth transistor, comprising a fourth control terminal electrically connected to the first control node, a fourth input terminal electrically connected to a third output terminal of the third transistor, and a fourth output terminal electrically connected to a constant voltage;
a fifth transistor, comprising a fifth control terminal electrically connected to the third output terminal of the third transistor, a fifth input terminal electrically connected to the first output terminal of the first transistor, and a fifth output terminal electrically connected to the second control node; and
a sixth transistor, comprising a sixth control terminal electrically connected to the first control node, a sixth input terminal electrically connected to the second control node, and a sixth output terminal electrically connected to a constant voltage,
wherein the pull-down module comprises:
a seventh transistor, comprising a seventh control terminal electrically connected to the second control node, a seventh input terminal electrically connected to the first control node, and a seventh output terminal electrically connected to a constant voltage;
an eighth transistor, comprising an eighth control terminal electrically connected to the second control node, an eighth input terminal electrically connected to the output terminal, and an eighth output terminal electrically connected to the constant voltage;
a ninth transistor, comprising a ninth control terminal electrically connected to a scan signal outputted by the next stage GOA circuit unit, a ninth input terminal electrically connected to the output terminal, and a ninth output terminal electrically connected to the constant voltage.

5. The GOA circuit of claim 4, wherein the input control module comprises a tenth transistor, comprising a tenth control terminal and a tenth input terminal electrically connected to a scan signal outputted by a previous stage GOA circuit unit, and a tenth output terminal electrically connected to the first control node.

6. The GOA circuit of claim 5, wherein the output control module comprises:
an eleventh transistor, comprising an eleventh control terminal electrically connected to the first control node, an eleventh input terminal electrically connected to the first clock signal, and an eleventh output terminal electrically connected to the output terminal;
a twelfth transistor, comprising a twelfth control terminal electrically connected to the first control node, and a twelfth input terminal electrically connected to the first clock signal; and
a capacitor, electrically connected between the first control node and the output terminal.

7. The GOA circuit of claim 4, wherein the first clock signal and the second clock signal are inversed.

8. A gate driver on array (GOA) circuit, comprising:
a plurality of GOA circuit units connected in cascade, with the GOA circuit unit at each stage outputting a scan signal via an output terminal based on the scan signal outputted by a previous stage GOA circuit unit, a scan signal outputted by a next stage GOA circuit unit, a first clock signal and a second clock signal; the GOA circuit unit at each stage comprises:
an input control module that is turned on when receiving the scan signal outputted by the previous stage GOA circuit unit so to control the voltage level of a first control node;
an output control module electrically connected to the first control node to control the outputted scan signal based on the voltage applied to the first control node;
a pull-down module, electrically connected to the output control module, so to pull down the voltage level of the scan signal based on the voltage level of the second control node; and
a pull-down holding module, electrically connected to the pull-down module, to hold the voltage level of the second control node during the non-scanning period, so to keep the scan signal at a low voltage level, comprising:
a first transistor, comprising a first control terminal and a first input terminal electrically connected to the first clock signal;
a second transistor, comprising a second control terminal and a second input terminal electrically connected to the first clock signal, and a second input terminal electrically connected to the second control node;
a third transistor, comprising a third control terminal and a third input terminal electrically connected to the second clock signal;
a fourth transistor, comprising a fourth control terminal electrically connected to a first control node, a fourth input terminal electrically connected to the third output terminal of the third transistor, and a fourth output terminal electrically connected to a constant voltage;
a fifth transistor, comprising a fifth control terminal and a fifth input terminal electrically connected to the second clock signal, and a fifth output terminal electrically connected to the second control node; and
a sixth transistor, comprising a sixth control terminal electrically connected to the first control node, a sixth input terminal electrically connected to the second control node, and a sixth output terminal electrically connected to the constant voltage,
wherein the pull-down module comprises:
a seventh transistor, comprising a seventh control terminal electrically connected to the second control node, a seventh input terminal electrically connected to the first control node, and a seventh output terminal electrically connected to a constant voltage;
an eighth transistor, comprising an eighth control terminal electrically connected to the second control node, an eighth input terminal electrically connected to the output terminal, and an eighth output terminal electrically connected to the constant voltage;
a ninth transistor, comprising a ninth control terminal electrically connected to a scan signal outputted by the next stage GOA circuit unit, a ninth input terminal electrically connected to the output terminal, and a ninth output terminal electrically connected to the constant voltage.

9. The GOA circuit of claim 8, wherein the input control module comprises a tenth transistor, comprising a tenth control terminal and a tenth input terminal electrically connected to a scan signal outputted by a previous stage GOA circuit unit, and a tenth output terminal electrically connected to the first control node.

10. The GOA circuit of claim 9, wherein the output control module comprises:
an eleventh transistor, comprising an eleventh control terminal electrically connected to the first control node, an eleventh input terminal electrically connected to the first clock signal, and an eleventh output terminal electrically connected to the output terminal;
a twelfth transistor, comprising a twelfth control terminal electrically connected to the first control node, and a twelfth input terminal electrically connected to the first clock signal; and
a capacitor, electrically connected between the first control node and the output terminal.

11. The GOA circuit of claim 8, wherein the first clock signal and the second clock signal are inversed.

* * * * *